US012581936B2

(12) United States Patent
Nakabayashi

(10) Patent No.: US 12,581,936 B2
(45) Date of Patent: Mar. 17, 2026

(54) INTERCONNECT SUBSTRATE

(71) Applicant: SHINKO ELECTRIC INDUSTRIES CO., LTD., Nagano (JP)

(72) Inventor: Yoko Nakabayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 361 days.

(21) Appl. No.: 18/341,111

(22) Filed: Jun. 26, 2023

(65) Prior Publication Data

US 2024/0006307 A1    Jan. 4, 2024

(30) Foreign Application Priority Data

Jun. 29, 2022    (JP) ................................. 2022-105098

(51) Int. Cl.
*H01L 23/522* (2006.01)
*H01L 23/498* (2006.01)
*H01L 23/538* (2006.01)

(52) U.S. Cl.
CPC .... *H01L 23/5226* (2013.01); *H01L 23/49827* (2013.01); *H01L 23/5385* (2013.01); *H01L 23/5386* (2013.01)

(58) Field of Classification Search
CPC ........... H01L 23/5226; H01L 23/49827; H01L 23/5385; H01L 23/5386
USPC ....................................................... 257/698
See application file for complete search history.

(56) References Cited

U.S. PATENT DOCUMENTS

2014/0347837 A1* 11/2014 Kariya ................. H05K 3/4694
156/247

FOREIGN PATENT DOCUMENTS

JP        2003-069226        3/2003
JP        2003-324277        11/2003
JP        2015-038909        2/2015

OTHER PUBLICATIONS

Office Action mailed on Sep. 2, 2025 with respect to the corresponding Japanese patent application No. 2022-105098.

* cited by examiner

*Primary Examiner* — Tu-Tu V Ho
(74) *Attorney, Agent, or Firm* — IPUSA, PLLC

(57) ABSTRACT

An interconnect substrate includes alternately stacked pads and insulating layers, and via interconnects extending through respective ones of the insulating layers, the via interconnects and the pads being alternately stacked in a vertical direction, the pads being electrically connected to each other via the via interconnects, wherein the pads include a first pad disposed on an uppermost one of the insulating layers and electrically connectable to a semiconductor chip, the first pad being an uppermost layer pad, a second pad disposed on a second uppermost one of the insulating layers, and a third pad disposed on a third uppermost one of the insulating layers, and wherein the uppermost one of the insulating layers located between the first pad and the second pad is thicker the second uppermost one of the insulating layers located between the second pad and the third pad.

5 Claims, 7 Drawing Sheets

INTERCONNECT SUBSTRATE

CROSS-REFERENCE TO RELATED APPLICATIONS

The present application is based on and claims priority to Japanese Patent Application No. 2022-105098 filed on Jun. 29, 2022, with the Japanese Patent Office, the entire contents of which are incorporated herein by reference.

FIELD

The disclosures herein relate to interconnect substrates.

BACKGROUND

Some interconnect substrates as known in the art have a plurality of pads and a plurality of insulating layers that are alternately stacked. This type of interconnect substrate has, for example, a stacked via structure as known in the art in which via interconnects extending through the respective insulating layers are vertically stacked with pads intervening therebetween. In addition, a plurality of solder bumps connected to a semiconductor chip are formed on the uppermost pads of the stacked via structure (see Patent Document 1, for example).

In the interconnect substrate described in Patent Document 1, the insulating layers have approximately the same thickness, so the via interconnects also have approximately the same thickness. When the via interconnects formed in the respective insulating layers have the same thickness, such a configuration may sometimes create a recess formed in the upper surfaces of the uppermost pads. In such a case, the heights of solder bumps vary depending on the depths of recesses, which presents difficulty in ensuring reliable connections between the interconnect substrate and the semiconductor chip.

Accordingly, there may be a need for an interconnect substrate for which the reliability of connections with a semiconductor chip is improved.

RELATED ART DOCUMENT

Patent Document

[Patent Document 1] U.S. Pat. No. 3,786,894

SUMMARY

According to an aspect of the embodiment, an interconnect substrate includes alternately stacked pads and insulating layers, and via interconnects extending through respective ones of the insulating layers, the via interconnects and the pads being alternately stacked in a vertical direction, the pads being electrically connected to each other via the via interconnects, wherein the pads include a first pad disposed on an uppermost one of the insulating layers and electrically connectable to a semiconductor chip, the first pad being an uppermost layer pad, a second pad disposed on a second uppermost one of the insulating layers, and a third pad disposed on a third uppermost one of the insulating layers, and wherein the uppermost one of the insulating layers located between the first pad and the second pad is thicker the second uppermost one of the insulating layers located between the second pad and the third pad.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
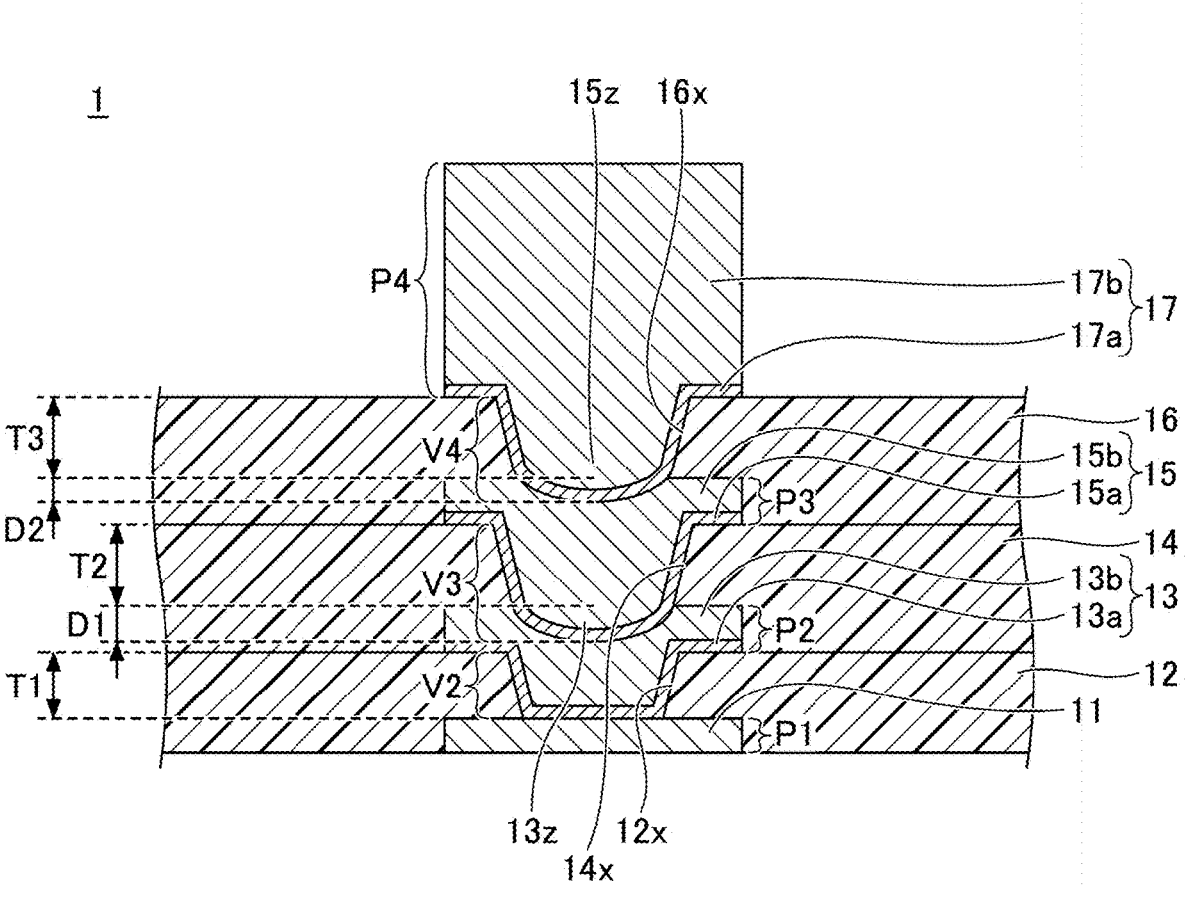
FIG. 1 is a cross-sectional view illustrating an example of a portion of an interconnect substrate according to a first embodiment.

In the following, embodiments for carrying out the invention will be described with reference to the accompanying drawings. In the drawings, the same components are denoted by the same reference numerals, and a duplicate description thereof may be omitted.

First Embodiment

[Structure of Interconnect Substrate]

FIG. 1 is a cross-sectional view illustrating an example of a portion of an interconnect substrate according to a first embodiment. With reference to FIG. 1, the interconnect substrate 1 according to the first embodiment is a coreless interconnect substrate including an interconnect layer 11, an insulating layer 12, an interconnect layer 13, an insulating layer 14, an interconnect layer 15, an insulating layer 16, and an interconnect layer 17.

In the first embodiment, for convenience of explanation, the side of the interconnect substrate 1 where the insulating layer 16 is provided is referred to as the upper side, and the side where the insulating layer 12 is provided is referred to as the lower side. The surface of a member on the upper side is referred to as the upper surface, and the surface of a member on the lower side is referred to as the lower surface. However, the interconnect substrate 1 may be placed upside down when used, or may be disposed at any angle. A plan view refers to a view of an object taken in the direction normal to the upper surface of the insulating layer 16. A plane shape refers to the shape of an object as viewed from the direction normal to the upper surface of the insulating layer 16.

In the interconnect substrate 1, the interconnect layer 11 includes a pad P1. The pad P1 is a first layer pad. The interconnect layer 11 may include an interconnect pattern. For example, copper or the like may be used as a material for the interconnect layer 11. A laminate film containing a copper layer, a gold layer or the like may alternatively be used as the interconnect layer 11. The thickness of the interconnect layer 11 may be, for example, about 1.3 μm to 2.6 μm. In the example illustrated in FIG. 1, the upper and lower surfaces of the interconnect layer 11 are flat surfaces, having no recesses formed therein. Alternatively, a recess may be formed on the upper surface of the interconnect layer 11. The lower surface of the interconnect layer 11 is exposed outside the insulating layer 12. The pad P1 may be used, for example, as an external connection terminal for electrical connection to another interconnect substrate or the like. As described later with reference to FIG. 7, a plurality of layers including an insulating layer and an interconnect layer, for example, may be provided on the lower surface side of the pad P1, and such an interconnect layer may be connected to the pad P1 through a via interconnect.

The insulating layer 12, which is the first insulating layer (i.e., the lowermost insulating layer), covers the upper surface and the lateral surface of the interconnect layer 11, without covering the lower surface thereof. The material of the insulating layer 12 may be, for example, a thermosetting insulating resin composed mainly of an epoxy-based resin or a polyimide resin. This insulating resin used as the material of the insulating layer 12 may be either photosensitive or non-photosensitive. The insulating layer 12 may contain a filler such as silica (SiO$_2$).

The interconnect layer 13 includes a pad P2 and a via interconnect V2. The pad P2 is a second layer pad. The interconnect layer 13 may also include an interconnect pattern that is not connected to the via interconnect. The pad P2 is formed on the upper surface of the insulating layer 12. The via interconnect V2 fills a via hole 12x that extends through the insulating layer 12 and that has a bottom end at the upper surface of the pad P1. The via hole 12x can be an inverted frustoconical recess in which the diameter of the top opening toward the pad P2 is larger than the diameter of the bottom opening at the upper surface of the pad P1. The diameters of the openings of the via hole 12x may be, for example, about 5 μm to 30 μm. The pad P2 is electrically connected to the pad P1 through the via interconnect V2.

The pad P2 has a recess 13z at the center of the upper surface thereof, the recess being a depression relative to the immediate surround area. The recess 13z is, for example, bowl-shaped. The term "bowl shaped" refers to a shape whose depth gradually increases from the periphery to the center to form a curved inner surface. The depth D1 of the recess 13z is, for example, 1 μm to 4 μm. A portion of the recess 13z may possibly be situated inside the via hole 12x. The depth D1 is defined as the distance from the upper surface of the pad P2 to the deepest part of the recess 13z.

The interconnect layer 13 may be a structure in which an electroplated layer 13b is laminated on a seed layer 13a, for example. The seed layer 13a is formed on the upper surface of the insulating layer 12 around the via hole 12x, and continuously extends on the inner lateral surface and bottom surface of the via hole 12x. The electroplated layer 13b fills the via hole 12x and extends upward beyond the upper surface of the insulating layer 12.

A laminate film in which a titanium layer and a copper layer are stacked in this order may be used as the seed layer 13a. Copper may be used as the material of the electroplated layer 13b, for example. The thickness of the seed layer 13a may be, for example, about 0.2 μm to 0.4 μm. The thickness of the electroplated layer 13b located above the upper surface of the insulating layer 12 may be, for example, about 1.5 μm to 2.5 μm.

The insulating layer 14, which is the second insulating layer, is formed on the insulating layer 12 to cover the upper surface and lateral surface of the pad P2 of the interconnect layer 13. The material of the insulating layer 14 may be an insulating resin similar to that of the insulating layer 12. The insulating layer 14 may contain a filler such as silica (SiO$_2$).

The interconnect layer 15 includes a pad P3 and a via interconnect V3. The pad P3 is a third layer pad. The interconnect layer 15 may include an interconnect pattern that is not connected to the via interconnect. The pad P3 is formed on the upper surface of the insulating layer 14. The via interconnect V3 fills a via hole 14x that extends through the insulating layer 14 and that has a bottom end at the upper surface of the pad P2. The via hole 14x may be an inverted frustoconical recess in which the diameter of the top opening toward the pad P3 is larger than the diameter of the bottom opening at the upper surface of the pad P2. The diameters of the openings of the via hole 14x may be, for example, about 5 μm to 30 μm. The pad P3 is electrically connected to the pad P2 through the via interconnect V3.

The pad P3 has a recess 15z at the center of the upper surface thereof, the recess being a depression relative to the immediate surrounding area. The recess 15z is, for example, bowl-shaped. The depth D2 of the recess 15z is shallower than the depth D1 of the recess 13z. When the depth D1 of the recess 13z is 3 μm or more, for example, the depth D2 of the recess 15z is less than 3 μm. The depth D2 is the distance from the upper surface of the pad P3 to the deepest part of the recess 15z.

The interconnect layer 15 may be, for example, a structure in which an electroplated layer 15b is laminated on a seed layer 15a. The seed layer 15a is formed on the upper surface of the insulating layer 14 around the via hole 14x and continuously extends on the inner lateral surface and bottom surface of the via hole 14x. The electroplated layer 15b fills the via hole 14x and extends upward beyond the upper surface of the insulating layer 14. The materials and thicknesses of the seed layer 15a and the electroplated layer 15b may be, for example, the same as those of the seed layer 13a and the electroplated layer 13b.

The insulating layer 16, which is the third insulating layer (and also the uppermost insulating layer), is formed on the insulating layer 14 to cover the upper surface and lateral surface of the pad P3 of the interconnect layer 15. The material of the insulating layer 16 may be an insulating resin similar to that of the insulating layer 12. The insulating layer 16 may contain a filler such as silica (SiO$_2$).

The interconnect layer 17 includes a pad P4 and a via interconnect V4. The pad P4 is a fourth layer pad (and also a top layer pad). The interconnect layer 17 may include an interconnect pattern that is not connected to the via interconnect. The pad P4 is formed on the upper surface of the insulating layer 16. The via interconnect V4 fills a via hole 16x that extends through the insulating layer 16 and that has a bottom end at the upper surface of the pad P3. The via hole 16x may be an inverted frustoconical recess in which the diameter of the top opening toward the pad P4 is larger than the diameter of the bottom opening at the upper surface of the pad P3. The diameters of the openings of the via hole 16x may be, for example, about 5 μm to 30 μm. The pad P4 is electrically connected to the pad P3 through the via interconnect V4.

The upper surface of the pad P4 is substantially flat. The term "substantially flat" means that no recess having a depth greater than 20% of the height of the pad is formed on the upper surface of the pad. The pad P4 is an external connection terminal for electrical connection to a semiconductor chip. The thickness of the pad P4 may be, for example, about 5 μm to 10 μm. The plane shape of the pad P4 may be, for example, a circle with a diameter of about 20 μm to 150 μm. The pitch of pads P4 may be, for example, about 30 μm to 50 μm.

The interconnect layer 17 may be, for example, a structure in which an electroplated layer 17b is laminated on a seed layer 17a. The seed layer 17a is formed on the upper surface of the insulating layer 16 around the via hole 16x and continuously extends on the inner lateral surface and bottom surface of the via hole 16x. The electroplated layer 17b fills the via hole 16x and extends upward beyond the upper surface of the insulating layer 16. The material and thickness of the seed layer 17a may be, for example, the same as the material and thickness of the seed layer 13a. The material of the electroplated layer 17b may be, for example, the same as the material of the electroplated layer 13b.

A surface treatment layer may be formed only on the upper surface of the pad P4 or formed on the upper surface and lateral surface of the pad P4. Examples of a surface treatment layer include an Au layer, a Ni/Au layer (i.e., a metal layer made by stacking an Ni layer and an Au layer in this order), a Ni/Pd/Au layer (i.e., a metal layer made by stacking an Ni layer, a Pd layer, and an Au layer in this order), and an Au/Pd/Au layer (i.e., a metal layer made by stacking an Au layer, a Pd layer, and an Au layer in this order). Further, only the upper surface of the pad P4 or the upper surface and lateral surface of the pad P4 may be subjected to an antioxidant treatment such as OSP (organic solderability preservative) treatment.

In the manner described above, the interconnect substrate 1 includes a plurality of pads (i.e., the pads P1 to P4) and a plurality of insulating layers (i.e., the insulating layers 12, 14, and 16) that are alternately stacked, and also includes via interconnect (i.e., the via interconnects V2, V3, and V4) that extend through the respective insulating layers and that are vertically stacked with the pads intervening therebetween to connect the pads to each other. This structure is called a stacked via structure as known in the art. The interconnect substrate 1 may include an unstacked via interconnect in any one of the insulating layers in addition to the stacked via structure.

[Thickness of Insulating Layer and Depth of Recess]

The plurality of pads in the interconnect substrate 1 include the pad P4 that is disposed on the uppermost insulating layer 16 and that is the uppermost layer pad electrically connected to the semiconductor chip, the pad P3 disposed on the second uppermost insulating layer 14, the pad P2 disposed on the third uppermost insulating layer 12, and the pad P1 covered by the third uppermost insulating layer 12. The thickness T3 of the insulating layer 16 sandwiched between the pad P4 and the pad P3 is thicker than the thickness T2 of the insulating layer 14 sandwiched between the pad P3 and the pad P2.

Use of the thickness T3 thicker than the thickness T2 causes the recess 15z of the third layer pad P3 to be shallower than the recess 13z of the second layer pad P2. Further, the upper surface of the fourth layer pad P4 becomes substantially flat. Even if a recess is formed in the upper surface of the fourth layer pad P4, such a recess is shallower than the recess 15z of the third layer pad P3. Moreover, the thickness T2 of the insulating layer 14 sandwiched between the pad P3 and the pad P2 is preferably thicker than the thickness T1 of the insulating layer 12 sandwiched between the pad P2 and the pad P1. Use of the thickness T3 thicker than the thickness T2 and the thickness T2 thicker than the thickness T1 makes it possible to make the recess 13z further shallower. This arrangement also makes the recess 15z further shallower, and brings the upper surface of the fourth layer pad P4 further closer to a flat surface. Such advantages are obtained based on the findings made by the inventors of the instant application as will be explained below.

Figure 2A:
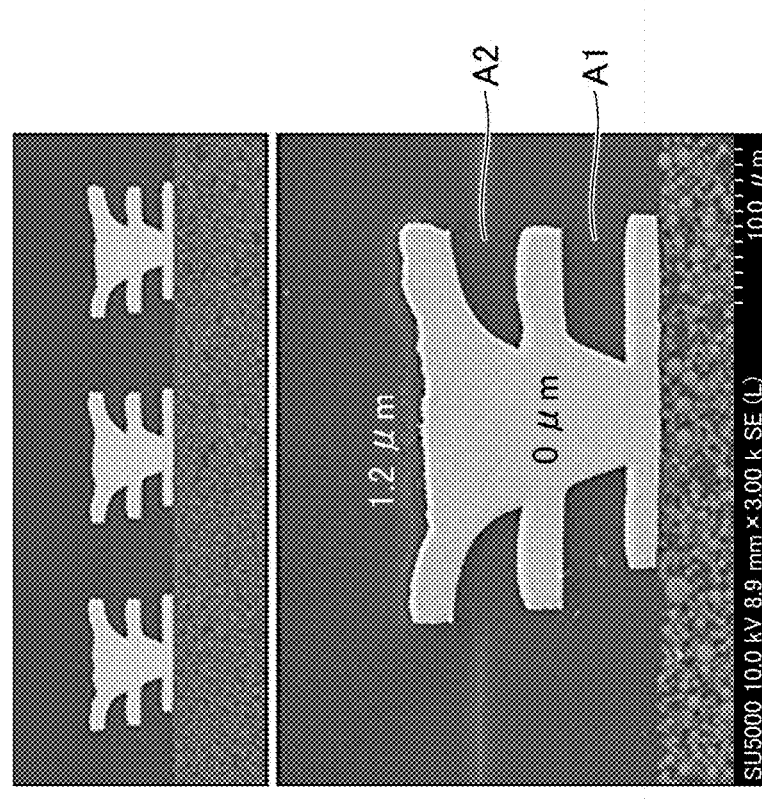
FIGS. 2A and 2B are drawings illustrates the thicknesses of insulating layers and the depths of recesses of pads obtained by experiments.
Figure 2B:
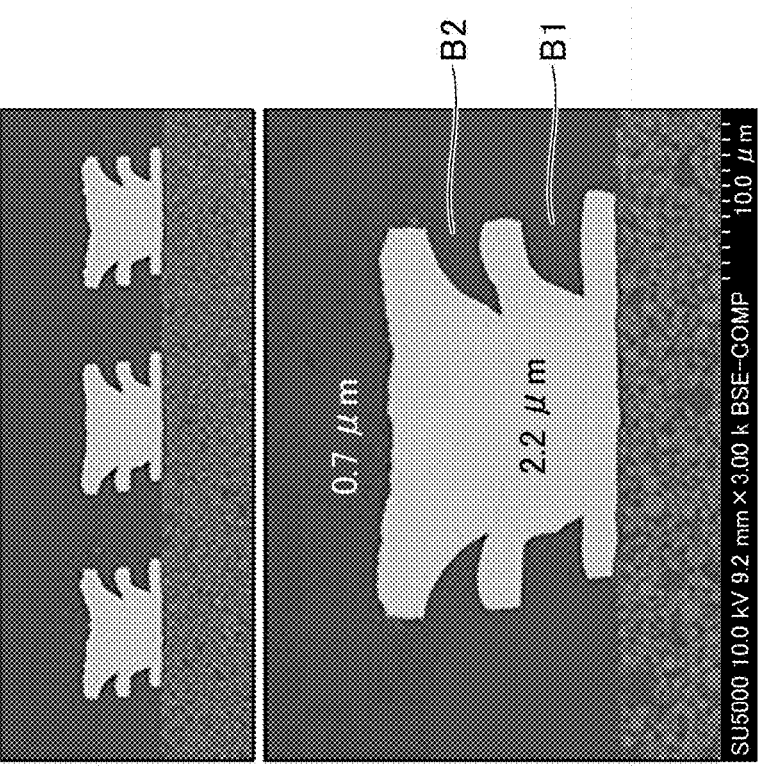

FIGS. 2A and 2B illustrate the thicknesses of insulating layers and the depths of recesses of pads obtained by experiments. FIG. 2A and FIG. 2B are SEM images of the cross section of an interconnect substrate. In FIG. 2A and FIG. 2B, the image at the bottom illustrates an enlarged view of a portion of the image at the top.

In FIG. 2A, the thickness (5.0 μm) of a second insulating layer A2 between the second layer pad and the third layer pad is the same as the thickness (5.0 μm) of a first insulating layer A1 between the first layer pad and the second layer pad. In FIG. 2A, the depth of the recess of the second layer pad formed on the first insulating layer A1 is 0 μm. The depth of the recess of the third layer pad formed on the second insulating layer A2 is 1.2 μm. As is observed herein, when the thicknesses of the insulating layer A1 and the insulating layer A2 are the same, the recesses formed in the pads of these layers have varying depths, and the recess of the upper layer pad does not have the tendency to be shallower than the recess of the lower layer pad.

On the other hand, in FIG. 2B, the thickness of a second insulating layer B2 (5.0 μm) located between the second layer pad and the third layer pad is thicker than thickness (4.0 μm) of a first insulating layer B1 located between the first layer pad and the second layer pad. In FIG. 2B, the depth of the recess of the second layer pad formed on the 33 first insulating layer B1 is 2.2 μm. The depth of the recess of the third layer pad formed on the second insulating layer B2 is 0.7 μm. As is observed herein, when the thickness of the second insulating layer B2 located between the second layer pad and the third layer pad is thicker than the thickness of the first insulating layer B1 located between the first layer pad and the second layer pad, the recess of the upper layer pad becomes shallower than the thickness of the lower layer pad.

It may be noted that some pads connected to a semiconductor chip are formed on via holes as in the case of the pad P4 illustrated in FIG. 1, while others are formed on the upper surface of an insulating layer where no via holes are formed. The upper surfaces of the pads formed on the upper surface of the insulating layer where no via holes are formed have no recess formed therein. Because of this, when a recess is formed in the upper surface of the pad P4, the heights of pads from the upper surface of the insulating layer 16 vary from pad to pad. With this variation in the heights of pads, the amount of solder may become insufficient for the lower-height pads when mounting a semiconductor chip on the interconnect substrate, which creates difficulty in ensuring reliable connections between the interconnect substrate and the semiconductor chip. In the interconnect substrate 1, however, variation in height between pads is reduced by making the upper surface of the pad P4 substantially flat, which improves the reliability of connections between the interconnect substrate 1 and a semiconductor chip when mounting the semiconductor chip on the interconnect substrate 1. It may be noted that any recess with a depth of less than 2.0 μm formed in the upper surface of the pad P4 does not significantly affect the reliability of connections between the interconnect substrate 1 and the semiconductor chip.

It may be noted that the interconnect substrate 1 has three insulating layers and four pad layers. In the case of an interconnect substrate having two insulating layers and three pad layers, third layer pads become the uppermost pads connected to a semiconductor chip. By making the thickness of the second insulating layer located between the second layer pads and the third layer pads thicker than the thickness of the first insulating layer located between the first layer pads and the second layer pads, the recesses of the uppermost pads become shallow, which reduces variation in height between the uppermost pads.

When the number of insulating layers is designated by n, and n is an integer that is 3 or more, an interconnect substrate may have n insulating layers and n+1 pad layers. It suffices that the thickness of the n-th insulating layer located between the n-th pad layer and the n+1-th pad layer is made thicker than the thickness of the n−1-th insulating layer located between the n−1-th pad layer and the n-th pad layer. This arrangement enables the realization of shallower recesses in the uppermost pads, thereby reducing variation in height between the uppermost pads.

Figure 3:
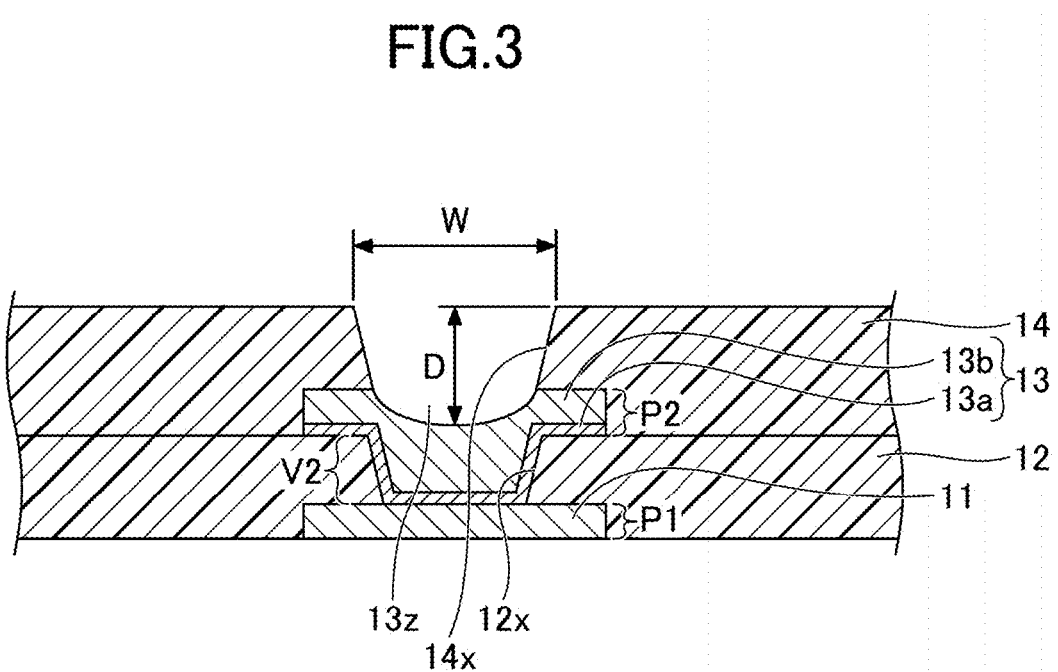
FIG. 3 is a drawing illustrating the aspect ratio of a via hole.

The inventors also studied the relationship between the aspect ratio of a via hole (i.e., that of a via interconnect) and the recess of a pad. As illustrated in FIG. 3, the aspect ratio of a via hole (i.e., that of a via interconnect) is defined as D/W by using a maximum width W and a maximum depth D of the hole. According to the study by the inventors, the depth of the recess in the upper surface of the pad formed on the via hole increases as the aspect ratio D/W decreases. In other words, increasing the aspect ratio D/W causes the depth of the recess in the upper surface of the pad formed on the via hole to decrease, and may even result in the nonexistence of a recess.

According to the study by the inventors, also, use of the aspect ratio D/W less than 0.4 may often result in the formation of a recess in the upper surface of the pad formed on the via hole. It is thus preferable that the aspect ratio D/W of each via hole (via interconnect) increases from a lower insulating layer toward the uppermost insulating layer, and that the aspect ratio D/W of a via hole (via interconnect) formed through the uppermost insulating layer is 0.4 or more. This arrangement makes the upper surface of an uppermost pad on a via hole substantially flat, thereby reducing variation in height between uppermost pads. As a result, the reliability of connections between the interconnect substrate and a semiconductor chip is ensured when mounting the semiconductor chip on the interconnect substrate.

When the thicknesses of pads are the same and the maximum widths W of via holes formed through respective insulating layers are the same, increasing the aspect ratio D/W means the same thing as thickening the insulating layer.

[Method of Making Interconnect Substrate]

FIGS. 4A to 4C through FIGS. 6A to 6C illustrate the method of making the interconnect substrate according to the first embodiment.

Figure 4A:
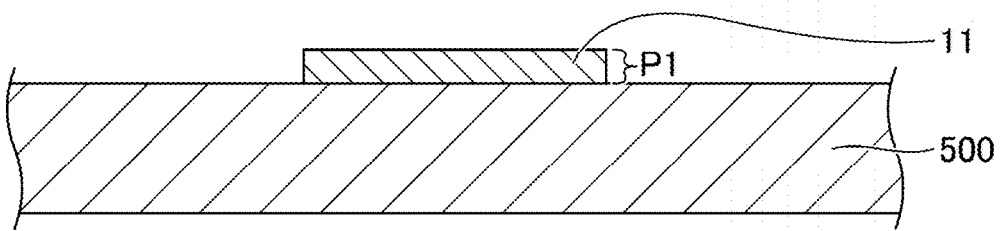
FIGS. 4A through 4C are drawings illustrating the method of making the interconnect substrate according to the first embodiment.

In the step illustrated in FIG. 4A, a support 500 is prepared, and an interconnect layer 11 including a pad P1 is formed on the upper surface of the support 500. The support 500 may be a metal plate, a silicon plate, a glass plate, or the like. The interconnect layer 11 including the pad P1 may be formed by, for example, placing a copper foil on the upper surface of the support 500, placing an etching mask having a predetermined shape on the copper foil, and etching the copper foil. When the support 500 is a metal plate, the interconnect layer 11 including the pad P1 may be formed by electroplating using the metal plate as the feed layer.

Figure 4B:
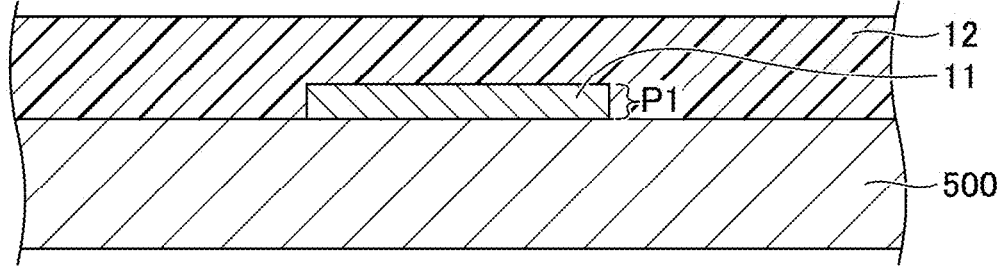

In the step illustrated in FIG. 4B, an insulating layer 12 is formed on the upper surface of the support 500 to cover the interconnect layer 11 including the pad P1. Specifically, an insulating resin film composed mainly of a thermosetting epoxy-based resin is prepared as the insulating layer 12, and is laminated on the upper surface of the support 500 to cover the interconnect layer 11 including the pad P1. Thereafter, the insulating layer 12 is heated above the curing temperature and cured while pressing the laminated insulating layer 12.

Alternatively, insulating resin liquid or paste composed mainly of a thermosetting epoxy-based resin, for example, is prepared as the material for the insulating layer 12, and is applied to the upper surface of the support 500 by spin coating or the like to cover the interconnect layer 11 including the pad P1. The applied insulating resin is heated above the curing temperature and cured to form the insulating layer 12.

Figure 4C:
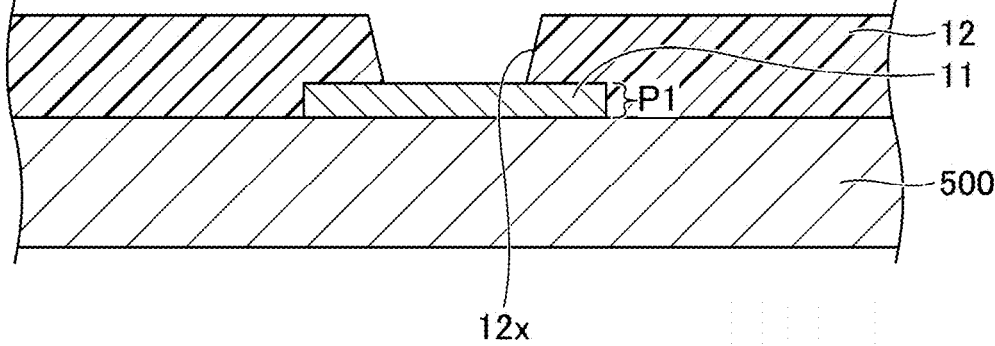

In the step illustrated in FIG. 4C, a via hole $12x$ is formed through the insulating layer 12, and exposes the upper surface of the pad P1 through the insulating layer 12. The via hole $12x$ may be formed by laser machining using, for example, a $CO_2$ laser. The via hole $12x$ formed by laser machining becomes an inverted frustoconical recess in which the diameter of the top opening toward the pad P2 is larger than the diameter of the bottom opening at the upper surface of the pad P1. Other via holes (not shown) also have the same shape when formed by laser machining. When the via hole $12x$ is formed by laser machining, a desmear process is preferably performed to remove a resin residue of the removed insulating layer 12 adhering to the upper surface of the pad P1 exposed at the bottom of the via hole $12x$.

Figure 5A:
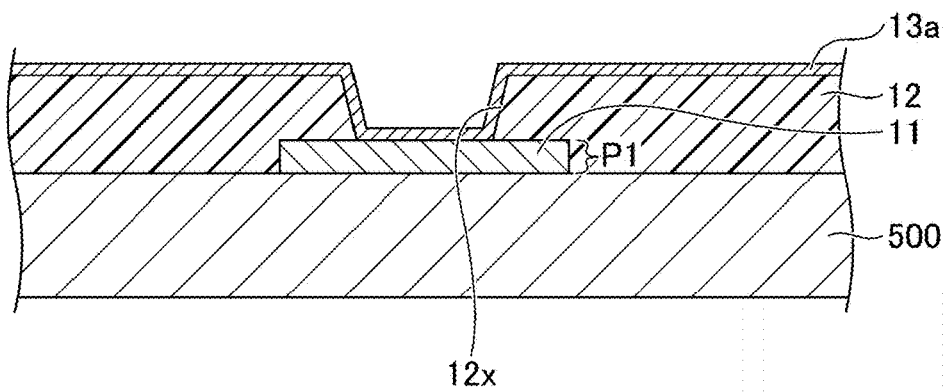
FIGS. 5A through 5C are drawings illustrating the method of making the interconnect substrate according to the first embodiment.
Figure 5B:
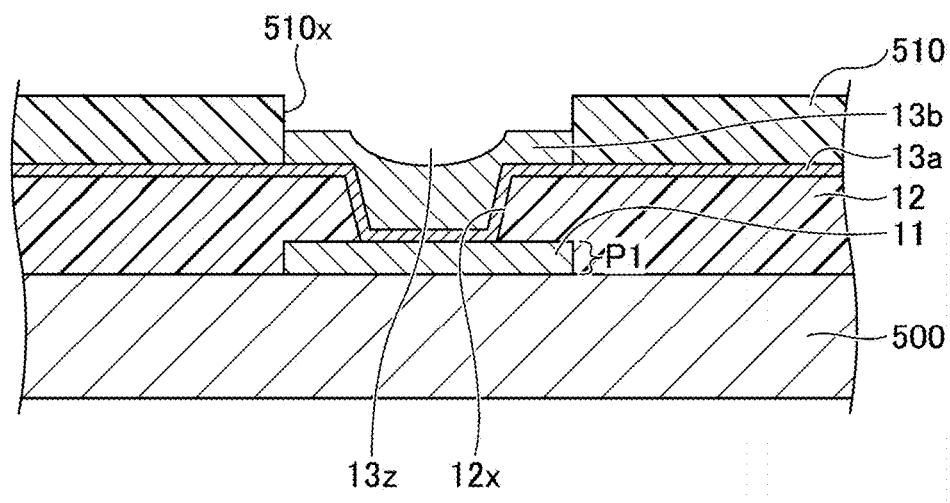
Figure 5C:
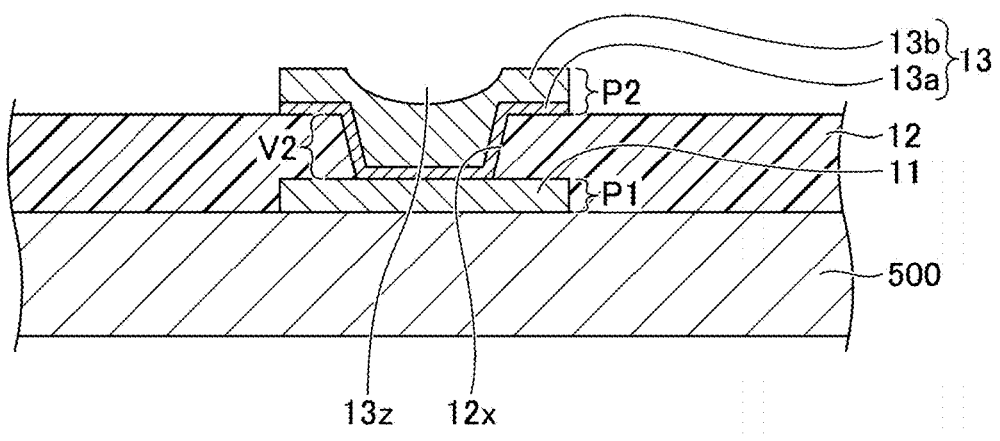

In the step illustrated in FIG. 5A through FIG. 5C, an interconnect layer 13 including a pad P2 and a via interconnect V2 are formed on the insulating layer 12. The pad P2 is electrically connected to the pad P1 via the via interconnect V2. The interconnect layer 13 including the pad P2 and the via interconnect V2 may be formed by, for example, a semi-additive method.

Specifically, as illustrated in FIG. 5A, a seed layer $13a$ is first formed on the upper surface of the pad P1 exposed at the bottom of the via hole $12x$ and on the insulating layer 12 including the inner lateral surface of the via hole $12x$ by electroless plating or sputtering.

As illustrated in FIG. 5B, a resist layer 510 with an opening $510x$ corresponding in position to the interconnect layer 13 is formed on the seed layer $13a$. An electroplated layer $13b$ is formed in the opening $510x$ of the resist layer 510 by an electroplating method using the seed layer $13a$ as a feed layer. This results in the formation of a recess $13z$, which is a depression relative to the immediate surrounding area, in the center of the upper surface of the electroplated layer $13b$.

As illustrated in FIG. 5C, after the resist layer 510 is removed, the portion of the seed layer $13a$ that is not covered with the electroplated layer $13b$ is removed by etching using the electroplated layer $13b$ as a mask. This forms an interconnect layer 13 in which the electroplated layer $13b$ is stacked on the seed layer $13a$. The materials and thicknesses of the seed layer $13a$ and the electroplated layer $13b$ are as previously described.

In the step illustrated in FIG. 6A, an insulating layer 14 is formed on the upper surface of the insulating layer 12 to cover the pad P2 similarly to the manner described in connection with FIG. 4B. A via hole $14x$ is thereafter formed through the insulating layer 14, and exposes the upper surface of the pad P2 through the insulating layer 14.

The insulating layer 14 is thicker than the insulating layer 12. An insulating resin film composed mainly of a thermosetting epoxy-based resin thicker than the insulating layer 12 is prepared as the insulating layer 14, for example, and is laminated on the upper surface of the insulating layer 12 to cover the pad P2. While pressing the laminated insulating layer 14, the insulating layer 14 is heated above the curing temperature and cured.

Alternatively, insulating resin liquid or paste composed mainly of a thermosetting epoxy-based resin is prepared as the material for the insulating layer 14, for example, and is applied to the upper surface of the insulating layer 12 by spin coating or the like to cover the pad P2. The applied insulating resin is then heated above the curing temperature and cured to form the insulating layer 14. In doing so, the insulating layer 14 thicker than the insulating layer 12 may be formed by lowering the rotation speed of spin coating or the like for applying the insulating resin.

Figure 6A:
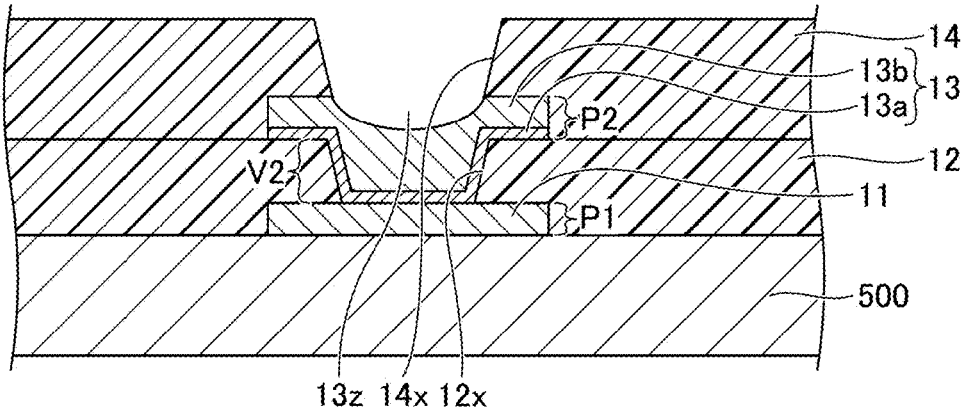
FIGS. 6A through 6C are drawings illustrating the method of making the interconnect substrate according to the first embodiment.
Figure 6B:
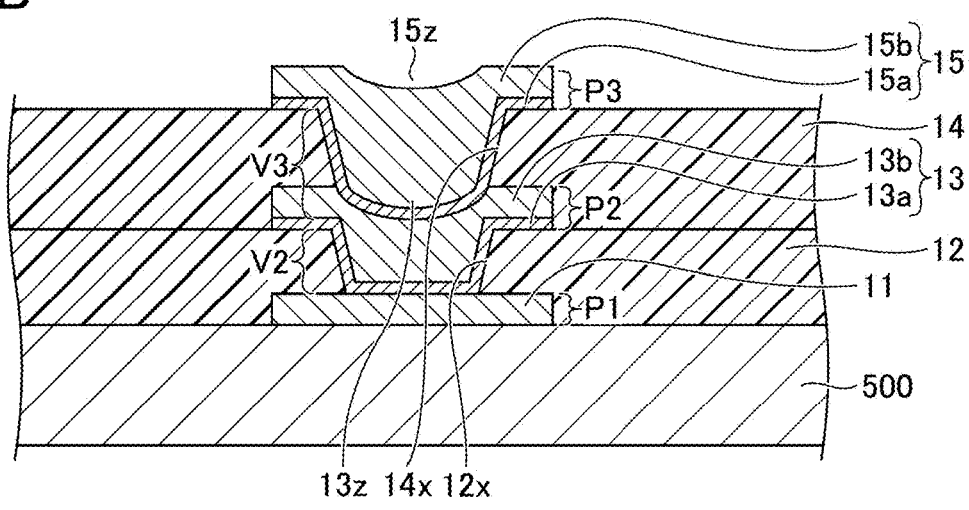

In the step illustrated in FIG. 6B, an interconnect layer 15 including a pad P3 and a via interconnect V3 are formed on the insulating layer 14 in substantially the same manner as in FIG. 5A through FIG. 5C. The pad P3 is electrically connected to the pad P2 via the via interconnect V3. This results in the formation of a recess 15z, which is a depression relative to the immediate surrounding area, in the center of the upper surface of the electroplated layer 15b. The depth of the recess 15z becomes shallower than the depth of the recess 13z.

Figure 6C:
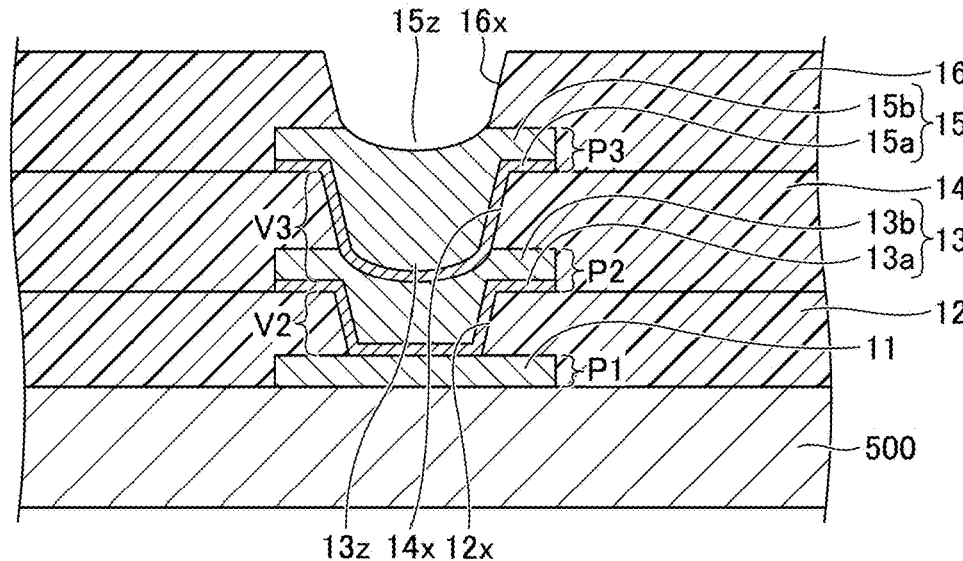

In the process illustrated in FIG. 6C, an insulating layer 16 is formed on the upper surface of the insulating layer 14 to cover the pad P3 as in FIG. 6A. A via hole 16x is then formed through the insulating layer 16, and exposes the upper surface of the pad P3 through the insulating layer 16. The insulating layer 16 is made to be the same thickness as the insulating layer 14 or thicker than the insulating layer 14. The thickness of the insulating layer 16 may be adjusted similarly to the manner used in the process of FIG. 6A.

After the step illustrated in FIG. 6C, an interconnect layer 17 including a pad P4 and a via interconnect V4 are formed on the insulating layer 16 in substantially the same manner as in FIG. 5A through FIG. 5C. The interconnect substrate 1 is then completed in final form by removing the support 500. The support 500 may be removed by mechanical peeling, or removed by etching or the like.

Variation of First Embodiment

A variation of the first embodiment is directed to an interconnect substrate having an additional insulating layer and interconnect layer under the pad P1 illustrated in FIG. 1. In the variation of the first embodiment, a description of the same components as those of the previously described embodiment may be omitted as appropriate.

Figure 7:
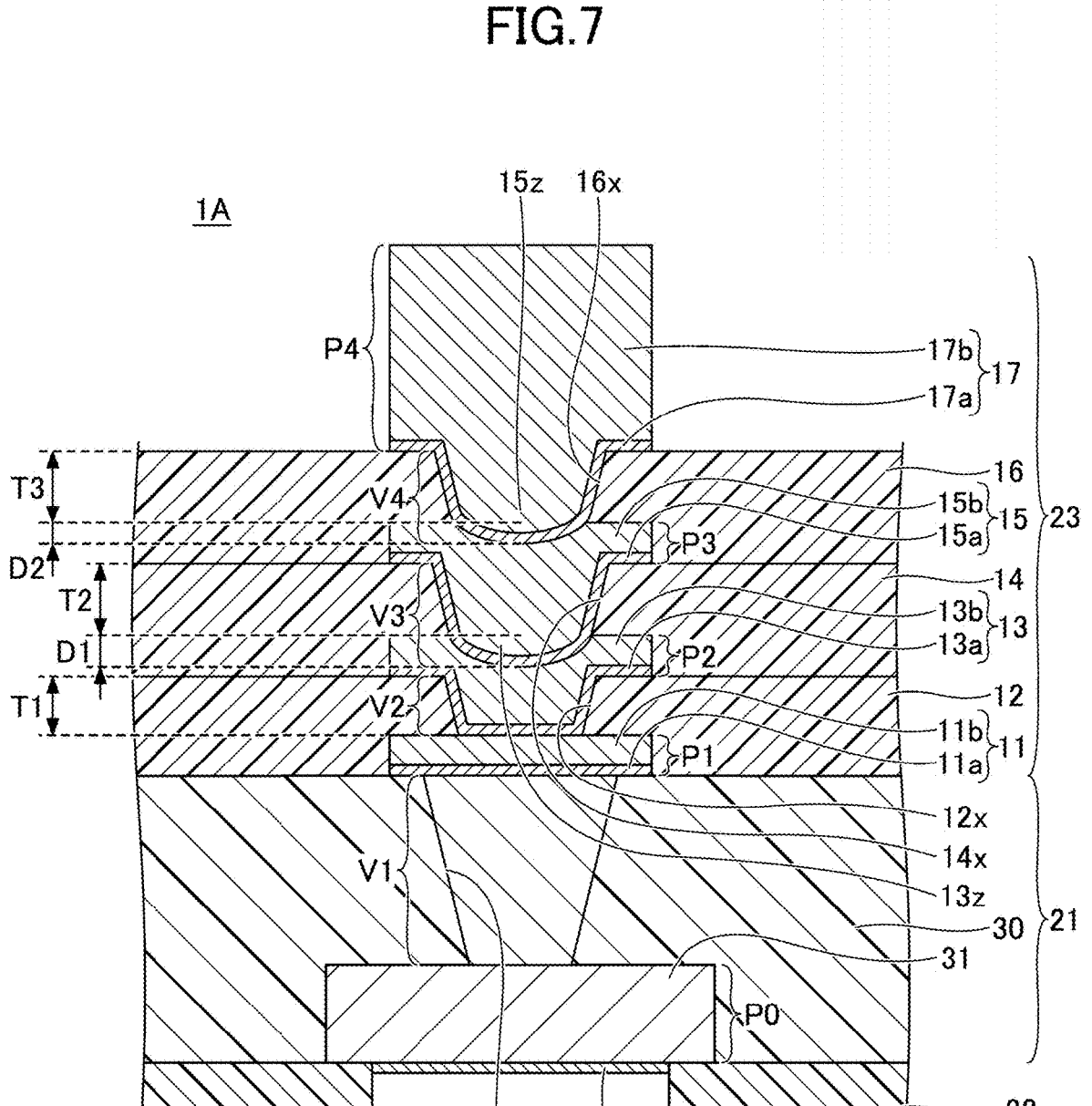
FIG. 7 is a cross-sectional view illustrating an example of a portion of an interconnect substrate according to a variation of the first embodiment.

FIG. 7 is a cross-sectional view illustrating an example of a portion of an interconnect substrate according to the variation of the first embodiment. As illustrated in FIG. 7, an interconnect substrate 1A according to the variation of the first embodiment includes an interconnect structure 21, a solder resist layer 22 laminated on the lower side of the interconnect structure 21, and an interconnect structure 23 laminated on the upper side of the interconnect structure 21. The interconnect substrate 1A may further include, on the insulating layer 16 of the interconnect structure 23, a solder resist layer having an opening through which the interconnect layer 17 is exposed.

The interconnect structure 23 has the same structure as the interconnect substrate 1 illustrated in FIG. 1 except that the interconnect layer 11 is replaced with a structure in which an electroplated layer 11b is stacked on a seed layer 11a. The line width and space (L/S) of the interconnect layers 11, 13, 15, and 17 of the interconnect structure 23 may approximately be, for example, from 2 μm and 2 μm to 3 μm and 3 μm, respectively. Here, the line width and space (L/S) indicate the width of interconnects and the space between adjacent interconnects.

The interconnect structure 21 is a low-density interconnect layer structure that includes an interconnect layer having a lower interconnect density than the interconnect structure 23. The interconnect structure 21 includes one insulating layer 30, one interconnect layer 31, and a via interconnect V1 extending through the insulating layer 30 in the thickness direction.

The interconnect layer 31 includes a pad P0. The interconnect layer 31 may include an interconnect pattern. Copper or a copper alloy, for example, may be used as the material for the interconnect layer 31. The thickness of the interconnect layer 31 may be, for example, about 15 μm to 20 μm. The line width and space (L/S) of the interconnect layer 31 may be, for example, about 20 μm and 20 μm, respectively. In the example illustrated in FIG. 7, the upper and lower surfaces of the interconnect layer 31 are flat surfaces with no recesses formed therein. Alternatively, a recess may be formed on the upper surface of the interconnect layer 31. The lower surface of the interconnect layer 31 is exposed outside the insulating layer 30. The pad P0 may be used, for example, as an external connection terminal for electrical connection to another interconnect substrate or the like.

The insulating layer 30 covers the upper and lateral surfaces of the interconnect layer 31 but does not cover the lower surface thereof. The material of the insulating layer 30 may be, for example, a thermosetting insulating resin composed mainly of epoxy-based resin, polyimide-based resin, or cyanate-based resin. The insulating layer 30 may be, for example, a glass epoxy resin substrate as known in the art, which is made by impregnating glass cloth (glass woven fabric) with a thermosetting insulating resin composed mainly of epoxy-based resin, which serves as a reinforcing material, and by curing the resin. The insulating layer 30 may contain a filler such as silica ($SiO_2$).

A via hole 30x having an opening toward the pad P1 is formed through the insulating layer 30, and exposes part of the upper surface of the interconnect layer 31 by extending through the insulating layer 30 in the thickness direction. The via hole 30x may be an inverted frustoconical recess in which the diameter of the top opening toward the pad P1 is larger than the diameter of the bottom opening at the upper surface of the interconnect layer 31. The diameters of the openings of the via hole 30x may be, for example, about 50 μm to 100 μm. The pad P1 is electrically connected to the pad P0 through the via interconnect V1 that fills the via hole 30x.

The upper end surface of the via interconnect V1 is exposed at the upper surface of the insulating layer 30. The upper end surface of the via interconnect V1 may be substantially flush with the upper surface of the insulating layer 30, for example. Like the upper surface of the insulating layer 30, the upper end surface of the via interconnect V1 is a smooth surface (low-roughness surface) with few surface irregularities. For example, the upper end surface of the via interconnect V1 is a polished surface. The surface roughness Ra of the upper end surface of the via interconnect V1 is designed to be, for example, about 15 nm to 40 nm.

The lower end surface of the via interconnect V1 is directly connected to part of the upper surface of the interconnect layer 31. That is, a portion of the upper surface of the interconnect layer 31 is in direct contact with the lower end surface of the via interconnect V1, and the interconnect layer 31 and the via interconnect V1 are electrically connected to each other. In other words, the interconnect layer 31 and the via interconnect V1 are not a seamless structure, and are formed as separate pieces despite that fact that they are electrically connected. Copper or a copper alloy, for example, may be used as the material of the via interconnect V1.

The solder resist layer 22 is laminated on the lower surface of the insulating layer 30 to cover part of the interconnect layer 31. The solder resist layer 22 has an opening 22x through which part of the interconnect layer 31 is exposed as an external connection pad P0. If necessary, a surface treatment layer 25 is formed on the surface of the pad P0 exposed through the opening 22x. The surface treatment layer 25 is similar to the previously described metal layers or layer made by an antioxidant treatment such as the OSP treatment.

The manufacturing steps of the interconnect substrate 1A include forming the interconnect layer 31 containing the pad P0 on the upper surface of the support 500 as in FIG. 4A. The insulating layer 30 is then formed on the upper surface of the support 500 to cover the interconnect layer 31 including the pad P0 as in FIG. 4B. The via hole 30x is formed through the insulating layer 30 to expose the upper surface of pad P0 through the insulating layer 30 as in FIG. 4C.

Subsequently, a conductive layer is formed by, for example, a semi-additive method to fill the via hole 30x and cover the entire upper surface of the insulating layer 30. The conductive layer disposed on the upper surface of the insulating layer 30 is polished and removed by, for example, CMP (Chemical Mechanical Polishing), together with part of the upper surface of the insulating layer 30. This forms the via interconnect V1 filling the via hole and the upper end surface of the via interconnect V1 and the upper surface of the insulating layer 30 become substantially flush with each other. Also, polishing the upper surface of the insulating layer 30 serves to smoothen the upper surface of the insulating layer 30. For example, polishing the upper surface of the insulating layer 30 achieves a surface roughness Ra of about 15 nm to 40 nm while the surface roughness Ra of the unpolished upper surface of the insulating layer 30 is about 300 nm to 400 nm.

After the above-noted process, the interconnect layer 11 including the pad P1 connected to the via interconnect V1 is formed on the upper surface of the insulating layer 30 by, for example, a semi-additive method. The interconnect layer 11 has a structure in which the electroplated layer 11b is laminated on the seed layer 11a. Thereafter, substantially the same process steps as in FIG. 4B through FIG. 6C are performed, followed by forming the interconnect layer 17 including the pad P4 and the via interconnect V4 on the insulating layer 16 in substantially the same manner as in FIG. 5A to FIG. 5C. The support 500 is removed, and the solder resist layer 22 is formed on the lower surface of the insulating layer 30 such that part of the pad P0 is exposed through the opening 22x. With this, the interconnect substrate 1A is completed in final form.

In the manner described above, an insulating layer and an interconnect layer may be further provided under the pad P1. In such a configuration, T1, T2 and T3 may be given the same mutual relationships as in the first embodiment, which causes the recess 15z of the pad P3 to be shallower than the recess 13z of the pad P2, and makes the upper surface of the pad P4 substantially flat. The example illustrated FIG. 7 is directed to a configuration in which the pad P0 and the via interconnect V1 are provided as separate pieces, but the pad P0 and the via interconnect V1 may be formed as a single seamless piece.

According to at least one embodiment, an interconnect substrate with improved reliability of connections with a semiconductor chip is provided.

Although the preferred embodiments have heretofore been described in detail, the present invention is not limited to the above described embodiments, and various modifications and substitutions may be made to these embodiments without departing from the scope of claims.

For example, although a coreless interconnect substrate has been described in the above described embodiments, the present invention is applicable to an interconnect substrate having a core board. In this case, the interconnect layer closest to the core board is the first interconnect layer (i.e., the lowermost interconnect layer), and the insulating layer closest to the core board is the first insulating layer (i.e., the lowermost insulating layer).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An interconnect substrate comprising:
alternately stacked pads and insulating layers; and
via interconnects extending through respective ones of the insulating layers, the via interconnects and the pads being alternately stacked in a vertical direction, the pads being electrically connected to each other via the via interconnects,
wherein the pads include:
a first pad disposed on an uppermost one of the insulating layers and electrically connectable to a semiconductor chip, the first pad being an uppermost layer pad;
a second pad disposed on a second uppermost one of the insulating layers; and
a third pad disposed on a third uppermost one of the insulating layers,
wherein a first portion of the uppermost one of the insulating layers is thicker than a second portion of the second uppermost one of the insulating layers, the first portion extending from a lower surface of the first pad to an upper surface of the second pad, the second portion extending from a lower surface of the second pad to an upper surface of the third pad, and
wherein the second pad and the third pad each have a recess in a center of an upper surface thereof, the recess being a depression relative to an immediate surrounding area, and the recess of the second pad is shallower than the recess of the third pad.

2. The interconnect substrate as claimed in claim 1, wherein the pads include a fourth pad covered by the third uppermost one of the insulating layers, and the second portion of the second uppermost one of the insulating layers is thicker than a third portion of the third uppermost one of the insulating layers, the third portion extending from a lower surface of the third pad to an upper surface of the fourth pad.

3. An interconnect substrate comprising:

alternately stacked pads and insulating layers; and via interconnects extending through respective ones of the insulating layers, the via interconnects and the pads being alternately stacked in a vertical direction, the pads being electrically connected to each other via the via interconnects, wherein the pads include:

a first pad disposed on an uppermost one of the insulating layers and electrically connectable to a semiconductor chip, the first pad being an uppermost layer pad;

a second pad disposed on a second uppermost one of the insulating layers; and a third pad disposed on a third uppermost one of the insulating layers, wherein a first portion of the uppermost one of the insulating layers is thicker than a second portion of the second uppermost one of the insulating layers, the first portion extending from a lower surface of the first pad to an upper surface of the second pad, the second portion extending from a lower surface of the second pad to an upper surface of the third pad, and wherein one of the via interconnects provided in the uppermost one of the insulating layers has an aspect ratio of 0.4 or more.

4. The interconnect substrate as claimed in claim 3, wherein an aspect ratio of a given one of the via interconnects increases from a lower one of the insulating layers to the uppermost one of the insulating layers.

5. An interconnect substrate comprising:

alternately stacked pads and insulating layers; and via interconnects extending through respective ones of the insulating layers, the via interconnects and the pads being alternately stacked in a vertical direction, the pads being electrically connected to each other via the via interconnects, wherein when a number of the insulating layers is denoted by n, and n is an integer greater than or equal to 3, a first portion of an n-th insulating layer among the insulating layers that is located between an n-th layer pad and an n+1-th layer pad among the pads is thicker than a second portion of an n−1-th insulating layer among the insulating layers that is located between an n−1-th layer pad and the n-th layer pad among the pads, the first portion extending from a lower surface of the n+1-th layer pad to an upper surface of the n-th layer pad, the second portion extending from a lower surface of the n-th layer pad to an upper surface of the n−1-th layer pad, and wherein the n-th layer pad and the n−1-th layer pad each have a recess in a center of an upper surface thereof, the recess being a depression relative to an immediate surrounding area, the n-th layer pad being located above the n−1-th layer pad, and the recess of the n-th layer pad is shallower than the recess of the n−1-th layer pad.

* * * * *